United States Patent [19]

Atkinson

[11] 4,438,365

[45] Mar. 20, 1984

[54] SPARK GAP FOR LINE TRANSIENT PROTECTION

[75] Inventor: Paul J. Atkinson, Buffalo Grove, Ill.

[73] Assignee: Zenith Radio Corporation, Glenview, Ill.

[21] Appl. No.: 348,640

[22] Filed: Feb. 16, 1982

[51] Int. Cl.³ .......................... H02H 1/04; H02H 9/06
[52] U.S. Cl. ...................................... 313/325; 315/91;
361/111; 361/120; 361/129; 313/306
[58] Field of Search .................. 313/325, 306; 315/91;
361/111, 112, 120, 129; 328/10

[56] References Cited

U.S. PATENT DOCUMENTS 3,811,064  5/1974  Kawiecki ........................... 313/325

FOREIGN PATENT DOCUMENTS 543068  3/1977  U.S.S.R. ............................. 313/325
581540  11/1977  U.S.S.R. ............................. 313/325

Primary Examiner—Eugene R. Laroche
Assistant Examiner—Vincent DeLuca

[57] ABSTRACT

An improved spark gap device and configuration for coupling the device in circuit with equipment such as television receivers are disclosed. The spark gap device includes three conductive pads, the first and second of which are separated by a first gap. The third pad is separated from the other pads by a second gap which intersects the first gap. By coupling the first and second pads across A.C. power lines in the equipment, and by coupling the third pad to earth ground, the energy associated with a high voltage transient on the power lines causes the air in one of the gaps to ionize. Hence, a spark jumps the gap to shunt the transient energy to ground. The intersection of the gaps causes ionization to spread to the second gap and thereby provide an additional path to ground for the energy associated with the transient, thereby protecting components within the equipment.

10 Claims, 4 Drawing Figures

SPARK GAP FOR LINE TRANSIENT PROTECTION

BACKGROUND OF THE INVENTION

This invention is directed to the protection of various types of equipment from high voltage transients by means of an improved spark gap which directs high voltage transients to earth ground. Television receivers are exemplary of the type of equipment which are advantageously protected by the invention.

It is well known that transients which are developed on an A.C. power line may be coupled into a television receiver and thereby destroy various components within the receiver. To prevent such problems, it is conventional to include a spark gap across the A.C. power line. Such an arrangement is shown in FIG. 1 wherein a spark gap 10 is coupled, within the receiver, across power lines 12 and 14. As shown, one of the power lines 14 is ordinarily at earth ground, while the other power line is at an elevated potential.

The spark gap 10 typically includes a pair of copper foil elements 16, 18 which are separated by an air gap such that they normally present an open circuit to the power lines. However, when a high voltage transient appears on the power lines, an arc jumps across the gap between elements 16 and 18 to shunt the high voltage transient to earth ground.

Unfortunately, this type of conventional spark gap does not provide sufficient protection for the receiver. In some circumstances, an arc does not form between elements 16 and 18 when a transient occurs, wherefore the energy associated with the transient travels into the receiver and damages various components therein.

Accordingly, it is an object of the invention to provide improved high voltage transient protection for electronic equipment.

It is another object of the invention to provide an improved spark gap for use in television receivers and similar equipment.

BRIEF DESCRIPTION OF THE FIGURES

The objects stated above and other objects of the invention are set forth more particularly in the following detailed description and in the accompanying drawings, of which.

DESCRIPTION OF THE PREFERRED EMBODIMENT

The present spark gap device and manner of coupling it in circuit with the equipment to be protected is described with reference to a television receiver. It should be understood, however, that many other types of equipment may be protected in like manner.

Figure 1:
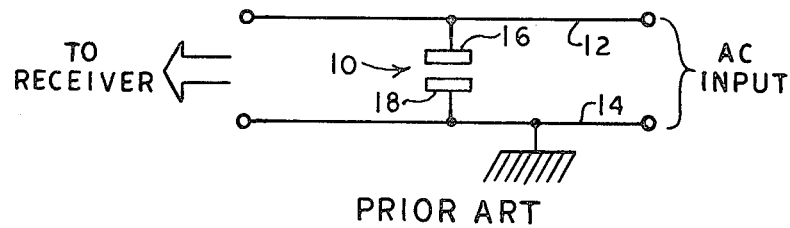
FIG. 1, previously described, illustrates a conventional spark gap coupled across a television receiver's power lines.
Figure 2:
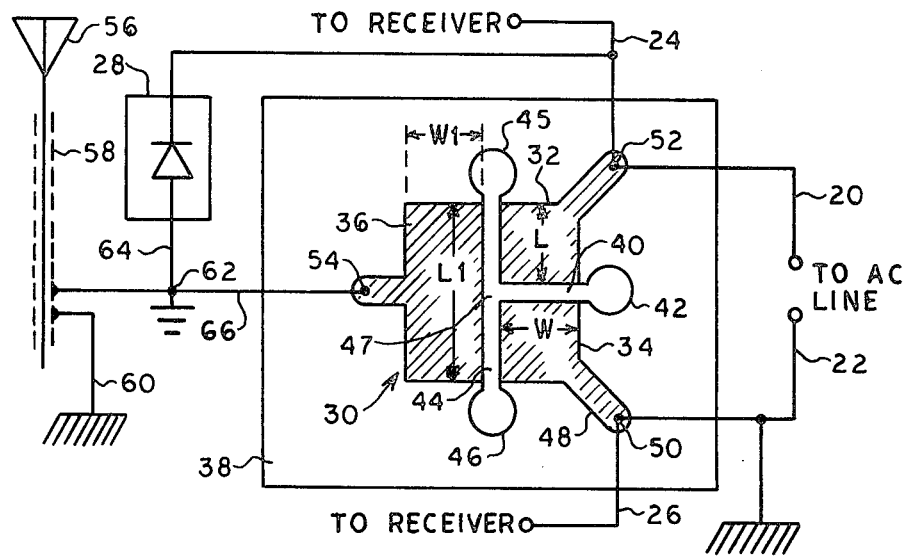
FIG. 2 shows a spark gap protection system according to the invention, including a preferred embodiment of a spark gap therefor.

Referring to FIG. 2, a pair of A.C. power lines 20, 22 are indicated as being coupled to a television receiver (not shown) via leads 24 and 26. One of the power leads, such as lead 22, will ordinarily be at earth ground and the other lead 20 will be at an elevated potential. Typically, these leads are connected to a rectifier 28 or other components in the receiver's power supply. It is these components which are most likely to be damaged by a large transient voltage between the power lines 20 and 22.

To protect the rectifier 28 and other components in the receiver, a spark gap 30 is provided. This spark gap includes a first conductive pad 32, a second conductive pad 34, and a third conductive pad 36. All three pads may be constructed of any suitable electrically conductive material and may be mounted on a printed circuit board 38. As shown, the pads 32 and 34 are substantially rectangular, have substantially equal lengths L and widths W, and are separated by a first air gap 40. This gap 40 preferably extends at least the full widths of the pads 32 and 34 and terminates in a circular portion 42. When the spark gap 30 is mounted on a printed circuit board, an aperture will be included in the printed circuit board below the gap 40 and will conform to the contour of the gap 40.

Referring to the pad 36, this pad is also substantially rectangular and its area, defined by width W1 and length L1, is approximately as large as the combined area of pads 32 and 34. The pad 36 is disposed equidistantly from the pads 32 and 34 so as to define a second gap 44 between the pad 36 and pads 32, 34. This second gap is preferably orthogonal to the gap 40, terminates in circular portions 45 and 46, and intersects the gap 40 as indicated at intersection 47. Thus, an area of overlap occurs between gaps 40 and 44 at the intersection 47 to form a composite T-shaped gap. An opening which conforms to the contour of the gap 44 is formed in the printed circuit board beneath the gap 44.

To couple the spark gap 30 in circuit with the receiver, each pad may have an extending arm such as arm 48 for coupling the spark gap to connection points 50, 52 and 54. At the point 50, the pad 34 is connected to the lead 26 and to the power line 22. At the point 52, the pad 32 is connected to the lead 24 and to the other power line 20. The pad 36 is coupled via the point 54 to an earth ground as explained below so that voltage transients on the power line 20 find a return path to the grounded power line 22.

In most installations, a television receiver receives its signal from an antenna 56 or any other suitable signal source. That signal source is coupled to the receiver by a cable having a shield 58 which is preferably connected to earth ground via a lead 60. At the point where the cable couples to the receiver, the shield 58 is connected to the receiver's chassis ground as indicated at connection point 62. The rectifier 28 and other components in the receiver are also coupled to chassis ground as schematically represented by a lead 64.

To couple the pad 36 to earth ground, another lead 66 connects the chassis ground point 62 to the connection point 54. Thus, the pad 36 is coupled to the shield 58 and to earth ground via chassis ground.

In operation, a high voltage transient which appears on the power line 20 is coupled to the pad 32, wherefore the air in either or both of the gaps 40, 44 becomes heated and ionized. Assuming that the air within the gap 40 first becomes conditioned to support a spark, the spark will jump from the pad 32 to the pad 34 to couple the transient's energy to the grounded power line 22, thereby shunting the transient from the rectifier 28 and other components within the receiver. The circular portion 42 at the end of the gap 40 increases the length of the gap to inhibit carbon buildup, thereby reducing the likelihood of creating a leakage path between pads 32 and 34. A similar function is provided by circular portions 45 and 46 at the ends of the gap 44.

Because the gaps 40 and 44 intersect with each other, the ionization which occurred in the gap 40 overlaps or spreads into the gap 44 to condition the air therein to support a spark from the pad 32 to the pad 36. Thus, the energy associated with the high voltage transient is also shunted to earth ground via the pad 36, chassis ground, and the shield 58. This extra path to earth ground for the high voltage transient has been found to provide superior protection for the components in the receiver.

When a high voltage transient causes a spark to jump first from the pad 32 to the pad 36, ionization of the air in the gap 44 overlaps or spreads into the gap 40 to support another spark between pads 32 and 34. Although not every transient will necessarily cause conduction across both gaps, severe voltage transients frequently result in sparks jumping both gaps.

Another advantage of the illustrated protection system is that it is capable of providing some protection from high voltage transients which may be picked up by the antenna 56 and the shield 58. For example, when lightning induces a high voltage transient in the shield 58, some of the energy associated with the transient is coupled to earth ground via the lead 60. If sufficient additional energy is coupled to the receiver's chassis ground, a spark jumps across the gap 44 to return that energy to earth ground via the power line 22.

In some instances, the shield 58 may not be coupled to earth ground, as by the lead 60. Nevertheless, protection against lightning surges is provided by the path to chassis ground across the gap 44 and to earth ground across the gap 40.

The pads 32, 34 and 36 may be constructed of copper foil, brass, or other suitable material, having a thickness of preferably five mils or greater. The width of the gap 40 is preferably 50 mils or greater, and the width of the gap 44 is preferably 60 mils or greater.

Although the pad 36 is preferably coupled to the earth-grounded shield 58, any other suitable manner of coupling the pad 36 to earth ground will provide protection from transients on the power lines. For example, where a receiver is powered from a three conductor power line (three prong system), the pad 36 may be coupled to one of the conductors which is designated as earth ground.

Equipment other than television receivers may obviously be protected by the present arrangement. The pads 32 and 34 need merely be coupled across the equipment's power lines, and the pad 36 coupled to earth ground.

Figure 3:
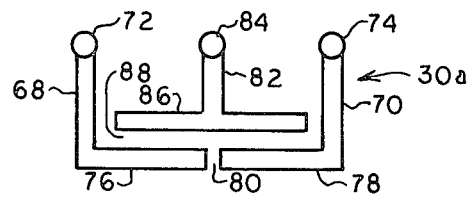
FIGS. 3 and 4 illustrate alternate embodiments of spark gaps which may be used as shown in FIG. 2.

Other forms of spark gaps which include intersecting gaps may also be employed in the system of FIG. 2. One such alternate form is shown in FIG. 3 to which reference is now made. This spark gap 30a includes a pair of L-shaped pads 68 and 70 which have connecting points 72 and 74 for coupling to the power lines 20 and 22, respectively. The other ends of these pads include legs 76 and 78 which extend toward or face each other to define a first gap 80 therebetween. A third pad 82 carries a connection point 84 for coupling this pad to earth ground in the manner described above. The other end of the pad 82 includes a leg 86 which extends parallel to legs 76, 78 and which is spaced equidistantly from the latter legs by a second gap 88. As shown, the gap 88 extends in a direction which is orthogonal to the gap 80 for intersecting therewith. With this construction, the spark gap 30a operates in a manner which is similar to the operation of the spark gap 30, i.e., two paths to earth ground are provided across a pair of intersecting gaps.

Figure 4:
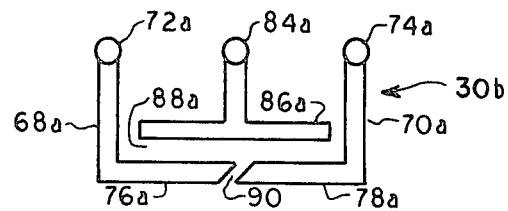

Another alternate spark gap 30b is shown in FIG. 4 for use in the protection system of FIG. 2. Components of the spark gap 30b which are similar to the components of the spark gap 30a have corresponding reference numerals followed by the character "a". As is evident, the only difference between spark gaps 30a and 30b is that the latter includes a first gap 90 which intersects the second gap 88a at an oblique angle to provide the gap 90 with a greater length.

It will be appreciated that a spark gap according to the invention may have any one of a variety of shapes, provided that three conductive pads are provided with at least two intersecting gaps to provide an area of mutual overlap between gaps. A high degree of component protection is thus provided for television receivers and other devices which are subject to damage by high voltage transients.

Although the invention has been described in terms of a preferred embodiment, it will be obvious to those skilled in the art that many alterations and modifications may be made thereto without departing from the invention. Accordingly, it is intended that all such alterations and modifications be considered as within the spirit and scope of the invention as defined by the appended claims.

What is claimed is:

1. For use with electronic equipment coupled to a first power line which is at earth ground and to another power line which is at an elevated potential, a spark gap, comprising:
   a first conductive pad adapted to be coupled to one power line;
   a second conductive pad adapted to be coupled to the other power line and spaced from the first pad so as to define a first gap therebetween; and
   a third conductve pad adapted to be coupled to earth ground and spaced from said first and second pads so as to define a second gap which intersects said first gap.

2. A spark gap as set forth in claim 1 wherein said second gap intersects said first gap so as to define a composite, T-shaped gap.

3. A spark gap as set forth in claim 2 wherein said first and second pads are rectangular and of substantially the same size, and wherein said third pad is rectangular and approximately twice as large as said first or second pad.

4. A spark gap as set forth in claim 1 wherein said first and second pads are L-shaped and have legs which face each other and which are separated from each other by said first gap, and wherein said third pad extends in a direction parallel to said legs and is spaced equidistantly from the first and second pads by said second gap.

5. A spark gap as set forth in claim 4 wherein said first and second gaps extend in mutually orthogonal directions.

6. A spark gap as set forth in claim 4 wherein said second gap extends in a direction which is oblique to the extension of said first gap.

7. For use with a television receiver coupled to a first power line which is at earth ground and to another power line which is at an elevated potential, a spark gap protection system comprising:
   a first, substantially rectangular, conductive pad having a given length and a given width;

a second substantially rectangular conductive pad having approximately said same given length and width and being spaced from the first pad so as to define a first gap therebetween;

a third substantially rectangular conductive pad having an area which is approximately equal to the combined areas of said first and second pads so as to define a second gap which orthogonally intersects the first gap;

means for coupling the first pad to one of the power lines;

means for coupling the second pad to the other power line; and means for coupling the third pad to earth ground.

8. For use with a television receiver coupled to a signal source via a shielded cable, coupled to a first power line which is at earth ground, and coupled to a second power line which is at an elevated potential, a spark gap protection system comprising:

a first conductive pad;

a second conductive pad spaced from the first pad so as to define a first gap therebetween;

a third conductive pad spaced from the first and second pads so as to define a second gap which intersects the first gap;

means for coupling the first pad to the first power line;

means for coupling the second pad to the second power line; and means for coupling the third pad to the shielded cable.

9. A spark gap protection system as set forth in claim 8 wherein the receiver includes a chassis ground and wherein the third pad is coupled to the shielded cable via chassis ground.

10. A spark gap protection system as set forth in claim 9 wherein the shielded cable is coupled to earth ground.

* * * * *